(12) United States Patent
Kim et al.

(10) Patent No.: US 7,943,440 B2
(45) Date of Patent: May 17, 2011

(54) FABRICATION METHOD OF THIN FILM DEVICE

(75) Inventors: Sang Jin Kim, Suwon (KR); Yongsoo Oh, Seongnam (KR); Hwan-Soo Lee, Seoul (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 0 days.

(21) Appl. No.: 12/503,004

(22) Filed: Jul. 14, 2009

(65) Prior Publication Data
US 2010/0151627 A1 Jun. 17, 2010

(30) Foreign Application Priority Data

Dec. 11, 2008 (KR) .................. 10-2008-0126015

(51) Int. Cl.
*H01L 21/78* (2006.01)
*H01L 21/50* (2006.01)

(52) U.S. Cl. ............... 438/149; 438/757; 257/E21.017; 257/E21.245

(58) Field of Classification Search ............. 438/113, 438/64, 49, 149, 660, 680, 706, 719, 724, 438/744, 757, 780; 257/E21.599, E21.499, 257/E21.017, E21.007, E21.051, E21.077, 257/E21.229, E21.245, E21.252, E21.266
See application file for complete search history.

(56) References Cited

U.S. PATENT DOCUMENTS

| 6,071,795 A | 6/2000 | Cheung et al. |
| 2006/0076584 A1* | 4/2006 | Kim et al. ............. 257/275 |
| 2007/0254490 A1* | 11/2007 | Jain ............. 438/736 |
| 2008/0202365 A1 | 8/2008 | Schneider et al. |

FOREIGN PATENT DOCUMENTS

| JP | 11-074533 | 3/1999 |
| KR | 10-2007-0085112 A | 8/2007 |

* cited by examiner

*Primary Examiner* — Matthew S Smith
*Assistant Examiner* — Walter H Swanson
(74) *Attorney, Agent, or Firm* — McDermott Will & Emery LLP

(57) ABSTRACT

A method for fabricating a thin film device includes the step of forming a sacrificial layer on a first substrate. A portion other than a region of the sacrificial layer is selectively removed. A material film is formed on the sacrificial layer to be connected to the first substrate via the selectively removed region. The material film portion filled in the selectively removed region is provided as an anchor. A thin film lamination is formed on the material film. The desired thin film device is formed by using a selective etching process. After removing the sacrificial layer, the thin film device floats over the first substrate with being supported by the anchor. A support body is temporarily attached on the thin film lamination. The thin film device is transferred to the support body onto a second substrate.

14 Claims, 4 Drawing Sheets

FABRICATION METHOD OF THIN FILM DEVICE

CROSS-REFERENCE TO RELATED APPLICATIONS

This application claims the priority of Korean Patent Application No. 2008-0126015 filed on Dec. 11, 2008, in the Korean Intellectual Property Office, the disclosure of which is incorporated herein by reference.

BACKGROUND OF THE INVENTION

1. Field of the Invention

The present invention relates to a method for fabricating a thin film device and, more particularly, to a method for fabricating a thin film device through a thin film transfer process that can be utilized as a fabrication technique of a flexible device.

2. Description of the Related Art

In general, a thin film transfer technique is commonly used for a thin film device such as a thin film transistor (TFT), an electronic device, and an optical device such as an organic electroluminescence (EL) device.

The thin film transfer technique generally refers to a technique of forming a required thin film on a preliminary substrate and transferring the thin film onto a permanent substrate to thus fabricate a desired thin film device. The thin film transfer technique can be advantageously used when conditions of a substrate used for film formation and those of a substrate used for the thin film device are different.

For example, in case where a relatively high temperature process is required, like a semiconductor film formation technique, but a substrate used for a device has a low heat resistance or a low softening point or melting point, the thin film transfer technique can be usefully applied. In particular, the thin film transfer technique is much useful for a flexible thin film device.

In the related art flexible device, which needs to have flexibility, an organic substrate such as polymer is used, on which an organic thin film is used as a thin film to form a function part. However, the function part implemented by the organic thin film cannot guarantee high performance, so the function part of the flexible device needs to be implemented by an inorganic substance such as polysilicon (Poly-Si) or oxide thin film. In this case, the high temperature semiconductor film formation technique cannot be directly applied to the flexible substrate, the organic body, so the thin film transfer technique is employed to transfer a thin film made of an inorganic material such as semiconductor on a preliminary substrate.

However, in the thin film transfer technique, a surface separated from the preliminary substrate is provided as an upper surface of the thin film transferred on the permanent substrate, and residues of a sacrificial layer remain on the upper surface, disadvantageously resulting in the necessity of a process of removing the residues of the sacrificial layer to prevent a negative influence on the thin film device.

Meanwhile, generally, the thin film transfer technique requires a cut and paste process. In detail, in order to separate the thin film device, a transferred body, from the initial substrate (also called a 'donor substrate'), the thin film device is partially fixed on the substrate by using an etching process and taken out by using a stamp or the like, or an acceptor substrate is stacked and then separated from the donor substrate by using a laser lift off (LLO) process. However, these processes are complicated, and deficiency such as stiction and damage of the thin film device is easily generated in the etching and separating process, and the like.

Thus, a method for simplifying the complicated cut-and-paste process and facilitating mass-production is required to be developed to accomplish a mass-productive thin film device fabrication technology.

SUMMARY OF THE INVENTION

An aspect of the present invention provides a method for fabricating a thin film device capable of simplifying an overall process and effectively transferring a thin film device.

According to an aspect of the present invention, there is provided a method for fabricating a thin film device, including: forming a sacrificial layer on a first substrate; selectively removing a portion other than a region of the sacrificial layer on which a thin film device is to be formed; forming a material film on the sacrificial layer such that the material film is connected to the first substrate via the selectively removed region, the material film portion filled in the selectively removed region being provided as an anchor; forming a thin film laminated body for a desired thin film device on the material film; forming the desired thin film device at the thin film laminated body by using a selective etching process executed to expose the sacrificial layer; removing the sacrificial layer through the exposed region of the sacrificial layer such that the thin film device floats over the first substrate; temporarily attaching a support body on the thin film laminated body including the thin film device and separating the thin film device from the thin film laminated body; and transferring the thin film device temporarily attached to the support body onto a second substrate.

The material film may be an oxide film or a nitride film.

The method for fabricating a thin film device may further include: forming a passivation film on the first substrate to protect the first substrate before forming the sacrificial layer, and in forming the material film on the sacrificial layer, the material film may be formed to be connected to the passivation film. In this case, the passivation film may be an oxide film or a nitride film.

The removing of the sacrificial layer may be performed by a dry etching process. The sacrificial layer may include amorphous silicon. In this case, the dry etching process can guarantee a high selectivity by using $XeF_2$ gas as an etchant.

In temporarily attaching the support body, the support body may be pressed such that the upper surface of the thin film laminated body and the surface of the support body are preliminarily attached. In this case, the support body may be poly dimethyl siloxane (PDMS)-based or silicon rubber-based polymer.

In forming the desired thin film device, the selective etching process may be performed such that the desired thin film device is partially connected to another region of the thin film laminated body.

In this case, in separating the thin film device, a physical force may be applied to the support body to which the thin film device is temporarily attached, to cut the portion where the thin film device and another region of the thin film laminated body are connected.

The bonding of the thin film device to the second substrate may include: bonding the thin film device on the second substrate by using a bonding material layer.

The second substrate may be a flexible substrate. For example, the thin film device maybe one of a thin film transistor, a solar battery, and a bio-sensor.

According to the present invention, because the surface of the thin film or the thin film pattern to be bonded to a permanent substrate is provided as a separated surface, the process of removing residues of the sacrificial layer can be omitted. Thus, the problem caused by the residues can be solved, and only the thin film device can be easily transferred in the form of an independent chip by using the anchor structure.

Also, in the process of fabricating the thin film device through a wiring and semiconductor process, removing the sacrificial layer, and then transferring the thin film device onto the desired substrate (e.g., flexible substrate), the adhesion problem and a change in the overall device characteristics due to laser irradiation can be minimized.

In addition, because the bonding surface changing process using the support structure is easily executed by virtue of an operation of a material interface such as van der Waal's force, without using a bonding layer, the overall process can be simplified.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
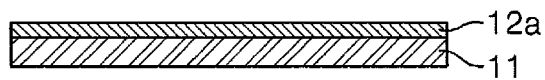
FIGS. 1A to 1E are sequential sectional views illustrating the process of forming a thin film laminated body in a thin film device fabrication method according to an exemplary embodiment of the present invention.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIGS. 1A to 1E are sequential sectional views illustrating the process of forming a thin film laminated body in a thin film device fabrication method according to an exemplary embodiment of the present invention.

As shown in FIG. 1A, a first substrate 11 is prepared. In this process, a passivation film 12a may be additionally formed on an upper surface of the first substrate 11 in a follow-up sacrificial layer removing process. The passivation film 12a may be an oxide film such as $SiO_2$ or a nitride film such as $SiN_x$.

The first substrate 11 may be suitable for forming a thin film for forming a particular function element. For example, if a desired thin film is semiconductor or metal, generally, a high temperature film forming process is required to make it grow. Thus, the first substrate 11 may be made of a material for satisfying growth surface conditions while retaining heat resistance. For example, the first substrate 11 may be not only made of silicon wafer used for the general semiconductor process but also may be one selected from one of gallium-arsenic (GaAs), sapphire, quartz, glass, magnesium oxide (MgO), lanthanum aluminate (LaAlO3), and zirconia.

Figure 1B:
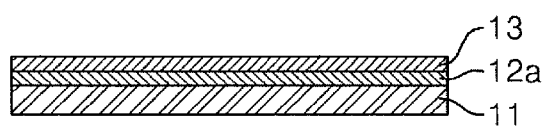

Next, as shown in FIG. 1B, a sacrificial layer 13 is formed on the first substrate 11 with the passivation film 12a formed thereon.

The sacrificial layer 13 may be favorably made of a material so long as it can be removed while satisfying a high selectivity with a peripheral material such as constituent of the thin film device by an etching process.

As the etching process, dry etching is preferably performed, and the constituent of the sacrificial layer 13 formed in this process may be amorphous silicon ($\alpha$-Si). The amorphous silicon having a high selectivity with a general semiconductor material and an electrode material may be easily etched by $XeF_2$ gas. This will be described in more detail in a follow-up process with reference to FIG. 3A.

Figure 1C:
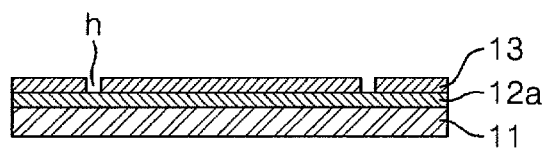

And then, as shown in FIG. 1C, regions (h) of the sacrificial layer 13, excluding a region where a thin film device is to be formed, are selectively removed.

The passivation film 12a may be exposed through the partially removed regions of the sacrificial layer 13. Of course, unlike the present embodiment, if the passivation film 12a is not formed, a corresponding region of the first substrate may be exposed. The removed regions of the sacrificial layer 13 are provided as anchor formation regions.

Figure 3A:
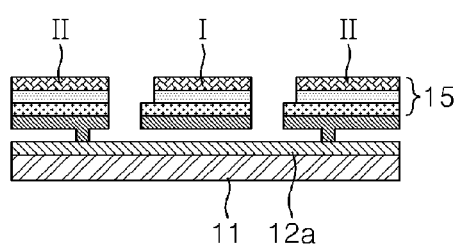
FIGS. 3A to 3D are sequential sectional views illustrating the process of transferring a transferred body in the thin film device fabrication method according to an exemplary embodiment of the present invention.
Figure 3B:
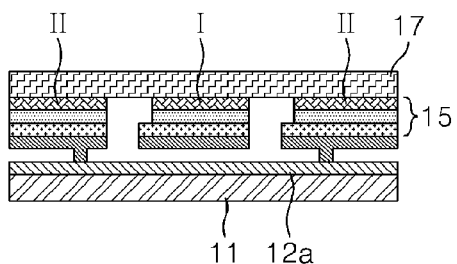
Figure 3C:
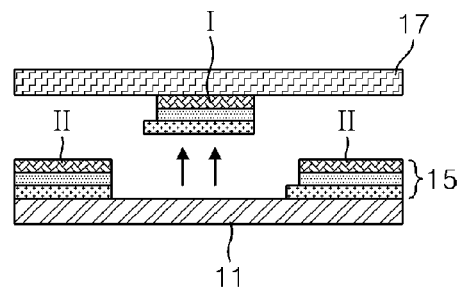

An anchor employed in the present embodiment of the present invention helps easily separate the thin film device ('I' in FIG. 3C) by leaving non-device regions ('II" in FIG. 3C on the first substrate 11 in a thin film device separating process (FIG. 3C) using a support. In consideration of this aspect, the sacrificial layer removal regions (h) corresponding to the anchor formation regions may be formed along the periphery of the thin film device.

Figure 1D:
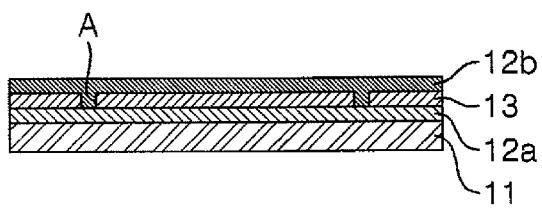

Thereafter, as shown in FIG. 1D a material film 12b is formed on the sacrificial layer 13 such that it is connected to the first substrate 11 via the selectively removed regions (h).

In this process, the portions of the material film 12b filled in the selectively removed regions are provided as anchors (A). The material film 12b may be an oxide film such as $SiO_2$ or a nitride film such as $SiN_x$. Also, the material film 12b, having a low etching rate with respect to the $XeF_2$ gas used as an etchant in a follow-up dry etching process (FIG. 3A), may act as an etch stop. In addition, because the material film 12b is made of a similar material as the passivation film 12a, it can be firmly connected to the passivation film 12a, and thus, the material film 12b may effectively act as the anchors (A) in the follow-up separating process (FIG. 3C).

Figure 1E:
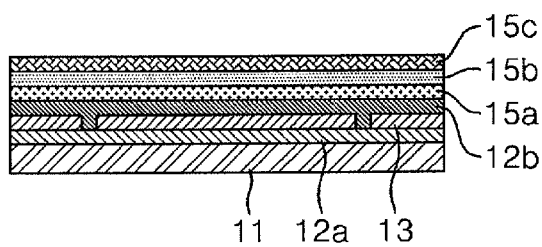

With reference to FIG. 1E, a thin film laminated body (15a, 15b, and 15c) for forming a desired thin film device is formed on the material film.

The thin film laminated body 15 may be an inorganic substance such as semiconductor or polysilicon or metal, and may be implemented by forming the plurality of layers 15a, 15b, and 15c required for constituting the desired thin film device by using a known film formation technique such as sputtering, evaporation, and chemical vapor deposition (CVD). The thin film device that may be implemented by using the present invention may include various types of flexible devices, and without being limited thereto, it may be also one of a thin film transistor (TFT), a solar battery, and a bio-sensor.

In the present embodiment, the thin film laminated body 15 is illustrated to have a structure in which a lower electrode 15a, a piezoelectric layer 15b, and an upper electrode 15c are sequentially formed. As the lower electrode 15a, a Ti/Pt layer may be deposited through sputtering. The piezoelectric layer 15b may be coated to be formed through a Sol-Gel process. The upper electrode 15c may be formed with platinum (Pt) through sputtering.

Subsequently, a process of forming the desired thin film from the thin film laminated body is performed. In this process, a selective etching process using lithography may be used to form the device region, and the sacrificial layer is partially exposed so as to be removed in a process of forming recesses for dividing the device region. This process will now be described in detail with reference to FIGS. 2A to 2E.

Figure 2A:
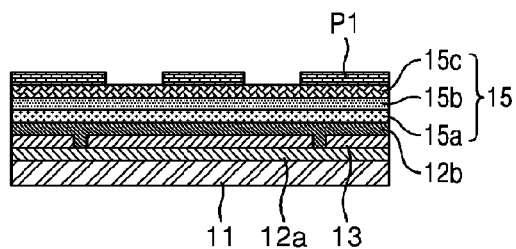
FIGS. 2A to 2E are sequential sectional views illustrating the process of forming a thin film device in the thin film device fabrication method according to an exemplary embodiment of the present invention.

First, as shown in FIG. 2A, first photoresist pattern P1 is formed on the thin film laminated body 15. Through the first photoresist pattern P1, regions of the upper electrode 15c and the piezoelectric layer 15b to be removed are exposed.

Figure 2E:
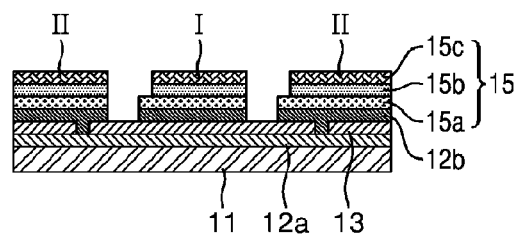
Figure 2B:
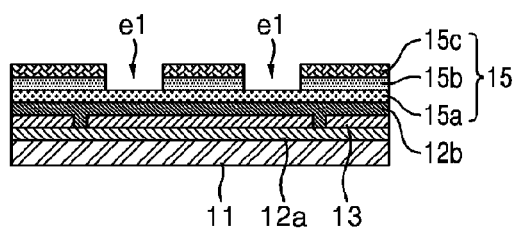

Next, as shown in FIG. 2B, the upper electrode 15c and the piezoelectric layer 15b are selectively removed by using the first photoresist pattern P1. The removing process may be performed through dry etching using an etchant gas having a low etching rate with respect to the lower electrode 15a material.

Figure 2C:
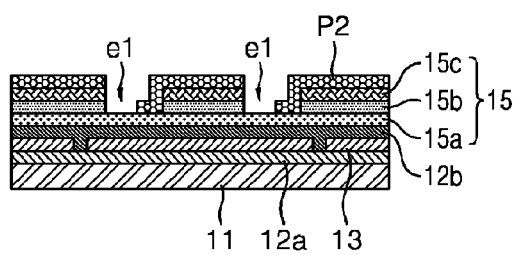

And then, as shown in FIG. 2C, a second photoresist pattern P2 is formed such that regions e1 of the lower electrode 15a to be removed are exposed. Through this process, the lower electrode 15a of the thin film laminated body 15 corresponding to the device region can be partially exposed.

Figure 2D:
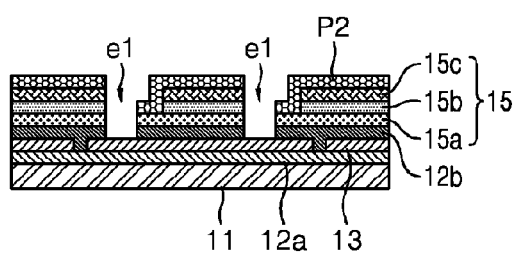

Thereafter, as shown in FIG. 2D, dry etching is performed on the lower electrode 15a to selectively remove the lower electrode 15a. Through this removing process of the lower electrode 15a, the thin film device (I) can be formed.

The selective etching process using the photoresist may be performed such that the thin film device (I) is partially connected to other regions (II) of the thin film laminated body 15. In this case, the other regions (II) of the thin film laminated body are portions fixed to the first substrate 11 by the anchors (A).

In this case, in the follow-up thin film device separating process (FIG. 3C, a physical force may be applied to the support body to which the thin film device (I) is temporarily attached to cut the connected portions of the thin film device (I) and other regions (II) of the thin film laminated body 15.

Subsequently, as shown in FIG. 2E, the second photoresist pattern (P2) on the thin film device (I) and the non-device regions (II) of the thin film laminated body 15 are removed. In this process, the exposed sacrificial layer 13 regions may be provided, for which an etching process for removing the sacrificial layer 13 can be applied.

FIGS. 3A to 3D are sequential sectional views illustrating the process of transferring a transferred body in the thin film device fabrication method according to an exemplary embodiment of the present invention.

As shown in FIG. 3A, the sacrificial layer 13 is partially removed by using an etching process.

Here, the anchor regions are not removed but remain to support the non-device regions on the first substrate. In addition, although anchor regions are not illustrated but act as an etching stop to allow the sacrificial layer under the non-device regions to remain. The remaining sacrificial layer regions may also work as a structure for maintaining the non-device regions on the first substrate.

As afore-mentioned, in the present invention, the dry etching may be favorably used as the etching process. If the sacrificial layer 13 is made of amorphous silicon, because it has a high selectivity with a general semiconductor material and electrode material, the sacrificial layer 13 can be easily etched. In this case, because the sacrificial layer has the high selectivity, the thin film device (I) can be stably protected and a problem that the thin film device (I) is adhered to the first substrate 11 as in the related art wet etching process can be solved.

Next, as shown in FIG. 3B, a support body 17 is temporarily attached on the thin film device (I).

The support body 17 is a temporary support structure used until before the thin film device (I) is transferred to a second substrate (permanent substrate). The support body 17 is tightly attached on the upper surface of the thin film device (I) so as to be preliminarily attached.

Here, the term 'preliminarily attachment' may be understood to mean an attachment force by which the thin film device (I) can be supported and handled at least until before a transferring process is performed, which is weaker than a bonding force by which the thin film device (I) is bonded with the second substrate after being transferred.

Namely, the 'preliminary attaching' process refers to attachment without using an additional means such as an adhesive or welding through a thermal treatment of high temperature. Preferably, the preliminary attaching process may be attaching the smooth surfaces of the thin film device (I) and the support body 17 such that they are temporarily attached by van der Waal's force. The preliminary attaching process may be sufficiently performed merely under a low pressure condition at a room temperature.

By doing that, after the thin film device (I) is transferred onto the second substrate, the support body 17 can be easily separated from the thin film device (I), and after the thin film device (I) is separated from the support body 17, the thin film device (I) is sure to have a clean state of the separated surface.

In order to easily accomplish the preliminary attachment by the der Waal's force, the support body 17 is preferably made of a material such as a poly dimethyl siloxane (PDMS) or silicon rubber-based polymer material. Of course, the material of the support body 17 is not limited thereto and any material may be used so long as it is easy for the preliminary attachment through a similar interface operation.

The present invention is not limited to the above-mentioned preliminary attachment, and any other means such as an adhesive providing a weak attachment force with such a level as required for transferring the thin film device may be additionally used.

Next, as shown in FIG. 3C, the thin film device (I) attached to the support body 17 is separated from the first substrate 11.

The sacrificial layer region positioned under the thin film device (I) has been almost removed in the previous process, so the thin film device (I) can be easily separated. In a different embodiment, the portions (not shown) connecting the thin film device (I) and the non-device regions (II) may be mechanically damaged by a physical force for separating the thin film device (I) from the first substrate 11 in this process without performing any additional separation process on the portions, to thereby separate the thin film device (I) from the non-device regions (II).

Figure 3D:
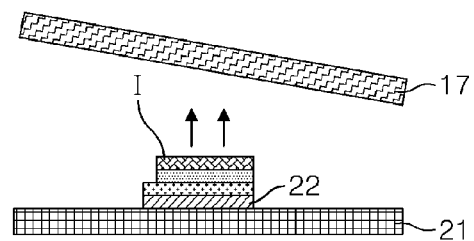

Subsequently, as shown in FIG. 3D, the thin film device (I) attached to the support body 17 is bonded on the second substrate 21, and the support body 17 is separated from the thin film device (I).

The terms 'second substrate' or 'permanent substrate' used in the description of the present invention corresponds to a substrate providing as a transfer place, namely, the substrate constituting the thin film device. In this process, the thin film device (I) and the second substrate 21 are bonded with a bonding force stronger than the strength of the temporary attachment between the support body 17 and the thin film device (I). To this end, like the present embodiment of the present invention, the thin film device (I) and the second substrate 21 may be bonded by the bonding material layer 22.

In this process, a bonding material containing a precursor having a stronger bonding force than the attachment force between the thin film device (I) and the support body 17 is coated thinly on the second substrate 21, and the thin film device (I) may be bonded thereto.

Meanwhile, although a material film remains on the separated surface of the thin film device (I) and the sacrificial layer 13 has not been completely removed, the separated surface of the thin film device (I) does not come in direct contact with the second substrate 21 but is preliminarily attached to the support body 17, the temporary support structure, and then, it is attached to the second substrate 21. Thus, the problem related to the residual material film and the problem related to the surface contaminated by the residues of the sacrificial layer can be solved.

As described above, the thin film device (I) and the second substrate 21 are bonded with a strong bonding force by the bonding material layer 22, so the thin film device (I) can be easily separated from the support body 17 having a relatively low bonding force. In particular, because the thin film device (I) and the support body 17 are preliminarily attached by the van der Waal's force, the separated surface of the thin film device (I) obtained after being separated from the support body 17 can be maintained in a very clean state.

The thin film transfer technique according to the embodiment of the present invention may be used for various types of thin film devices. In more detail, the thin film transfer technique may be advantageously used for a case where, like the semiconductor film formation technique, a relatively high temperature process is requested but a substrate used for a device has a low heat resistance or a low softening point or melting point. In particular the thin film transfer technique can be usefully applied for a flexible thin film device.

The second substrate 21 may be a flexible substrate made of a polymer material, and the thin film device is made of polysilicon or an inorganic substance or metal. The thin film may be, for example, one of a thin film transistor, a solar battery, and a bio-sensor.

The process of forming the anchor according to an embodiment of the present invention will now be described in detail.

In the present exemplary embodiment, tungsten oxide ($WO_x$) is deposited as the passivation film on the substrate. Subsequently, amorphous silicon is deposited as the sacrificial layer, and then the deposited sacrificial layer is partially etched to form the anchor formation regions with a width of about 1 μm. Thereafter, the material film, silicon nitride ($SiN_x$), is deposited to allow the material film to be connected to the passivation film via the anchor formation regions. $PEO_x$ is additionally deposited as an insulating layer for protecting the device, and PZT/Pt is deposited as the laminated body for the thin film device.

Figure 4:
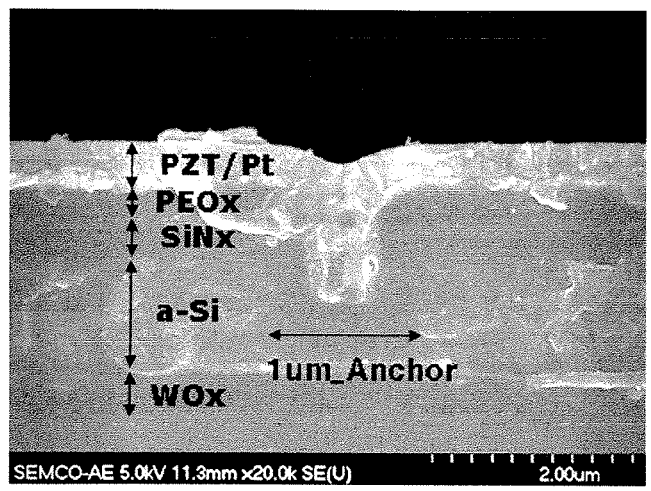
FIG. 4 is an SEM photograph obtained by capturing an anchor periphery region (before etching a sacrificial layer) in a laminated structure fabricated according to an exemplary embodiment of the present invention.

FIG. 4 is an SEM photograph obtained by capturing the anchor periphery region fabricated according to an exemplary embodiment of the present invention.

Figure 5:
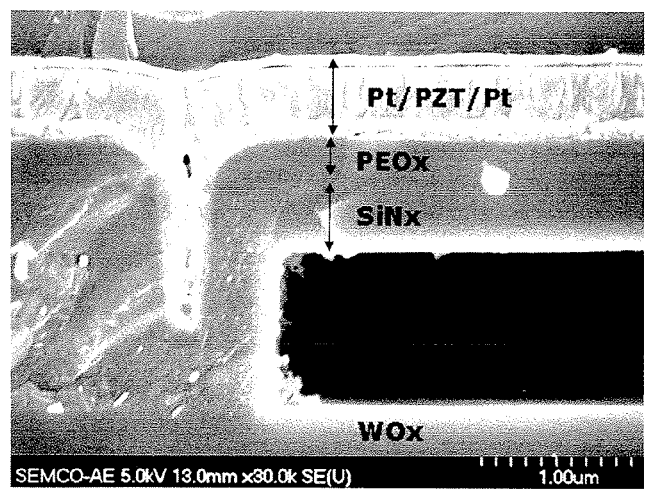
FIG. 5 is an SEM photograph obtained by capturing the anchor periphery region (after etching the sacrificial layer) in the laminated structure fabricated according to an exemplary embodiment of the present invention.

Subsequently, through the thin film device formation process as shown in FIGS. 2A to 2E, the sacrificial layer made of amorphous silicon is partially exposed, and the sacrificial layer region under the device region is removed to make the thin film float. The sacrificial layer removing process may be executed by using $XeF_2$ gas. After this removing process, the other portion (corresponding to the non-device regions) of the sacrificial layer may remain, rather than being removed due to the anchor. The removed state of the sacrificial layer portion positioned under the device through dry etching is illustrated in FIG. 5.

Figure 6:
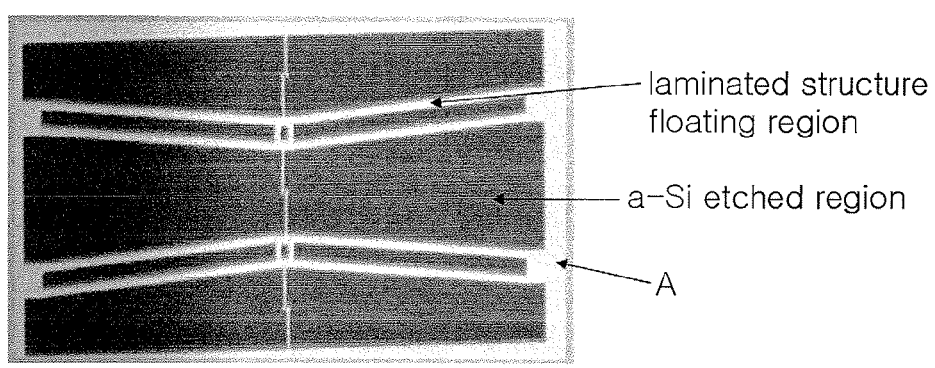
FIG. 6 is an optical microscope photograph obtained by capturing a transferred object (after etching the sacrificial layer) fabricated according to an exemplary embodiment of the present invention.

FIG. 6 is an optical microscope photograph obtained by capturing an upper flat surface of a transferred object (after etching the sacrificial layer) fabricated according to an exemplary embodiment of the present invention. The region where the stacked laminated body floats together the anchor region (A) positioned to surround the device region and the region where the sacrificial layer of amorphous silicon (a-Si) has been removed are observed.

As set forth above, according to exemplary embodiments of the invention, only the thin film device can be easily transferred in the chip form onto the desired permanent substrate by using the anchor structure employed in the present invention.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for fabricating a thin film device, the method comprising:
    forming a sacrificial layer on a first substrate;
    selectively removing a region of the sacrificial layer surrounding a portion of the sacrificial layer on which a thin film device is to be formed;
    forming a material film on the sacrificial layer such that the material film is connected to the first substrate via the selectively removed region, a material film portion filled in the selectively removed region being provided as an anchor;
    forming a thin film laminated body for a thin film device on the material film;
    forming the thin film device at the thin film laminated body by using a selective etching process executed to expose the sacrificial layer;
    removing the sacrificial layer through an exposed region of the sacrificial layer such that the thin film device floats over the first substrate;
    temporarily attaching a support body on the thin film laminated body including the thin film device and separating the thin film device from the thin film laminated body; and
    transferring the thin film device temporarily attached to the support body onto a second substrate.

2. The method of claim 1, wherein the material film is an oxide film or a nitride film.

3. The method of claim 1, further comprising:
    forming a passivation film on the first substrate to protect the first substrate, before forming the sacrificial layer, and
    in forming the material film on the sacrificial layer, the material film is formed to be connected to the passivation film.

4. The method of claim 3, wherein the passivation film is an oxide film or a nitride film.

5. The method of claim 1, wherein the removing of the sacrificial layer is performed by a dry etching process.

6. The method of claim 5, wherein the sacrificial layer is amorphous silicon.

7. The method of claim 6, wherein the dry etching process is executed by using $XeF_2$ gas as an etchant.

8. The method of claim 1, wherein, in temporarily attaching the support body, the support body is pressed such that an upper surface of the thin film laminated body and a surface of the support body are preliminarily attached.

9. The method of claim 8, wherein the support body is poly dimethyl siloxane (PDMS)-based or silicon rubber-based polymer.

10. The method of claim 1, wherein, in forming the thin film device, the selective etching process is performed such that the thin film device is partially connected to another region of the thin film laminated body.

11. The method of claim 10, wherein, in separating the thin film device, a physical force is applied to the support body to which the thin film device is temporarily attached, to cut a portion where the thin film device and another region of the thin film laminated body are connected.

12. The method of claim 1, wherein the transferring of the thin film device to the second substrate comprises bonding the thin film device on the second substrate by using a bonding material layer.

13. The method of claim 1, wherein the second substrate is a flexible substrate.

14. The method of claim 1, wherein the thin film device is one of a thin film transistor, a solar battery, and a bio-sensor.

* * * * *